(12) United States Patent
Shofman et al.

(10) Patent No.: US 11,587,776 B1
(45) Date of Patent: Feb. 21, 2023

(54) ION DETECTION SYSTEMS

(71) Applicant: EL-MUL TECHNOLOGIES LTD., Rehovot (IL)

(72) Inventors: Semyon Shofman, Kiryat Ekron (IL); Alexander Kadyshevitch, Tel Aviv (IL)

(73) Assignee: El-Mul Technologies LTD, Rehovot (IL)

( * ) Notice: Subject to any disclaimer, the term of this patent is extended or adjusted under 35 U.S.C. 154(b) by 241 days.

(21) Appl. No.: 16/888,850

(22) Filed: Jun. 1, 2020

Related U.S. Application Data (60) Provisional application No. 62/854,323, filed on May 30, 2019.

(51) Int. Cl.
  *H01J 49/02* (2006.01)
  *H01J 49/20* (2006.01)
  *H01J 49/40* (2006.01)

(52) U.S. Cl.
  CPC ............ *H01J 49/025* (2013.01); *H01J 49/20* (2013.01); *H01J 49/40* (2013.01); *H01J 49/408* (2013.01)

(58) Field of Classification Search
  CPC .......... H01J 49/025; H01J 49/20; H01J 49/40; H01J 49/408
  USPC .................... 250/281, 282, 283, 492.1, 492.3
  See application file for complete search history.

(56) References Cited

U.S. PATENT DOCUMENTS

| | | | |
|---|---|---|---|
| 4,359,706 A | 11/1982 | Flack | |
| 7,180,060 B2 | 2/2007 | Chefetz et al. | |
| 2011/0095177 A1* | 4/2011 | Giannakopulos | H01J 49/025 250/281 |
| 2015/0262806 A1* | 9/2015 | Shimomura | G01T 1/28 250/289 |
| 2020/0264042 A1* | 8/2020 | Shofman | G01J 1/44 |

FOREIGN PATENT DOCUMENTS

WO  2006120005  11/2006

OTHER PUBLICATIONS

Abele at. al. ,"Methodology of pole piece design in permanent magnets", Journal of Applied Physics 99, 08D903 (2006).

* cited by examiner

*Primary Examiner* — Nicole M Ippolito (57) ABSTRACT

An ion detection system comprising an upper plate configured for propagation of ions therethrough, a lower plate comprising a converter configured for converting ions impinging thereon to secondary electrons, a secondary electron multiplication assembly configured for receiving the secondary electrons and comprising at least one or optionally a series of oppositely facing pairs of dynodes, wherein in the optional series of oppositely facing pairs of dynodes, each pair is spaced apart from an adjacent pair, and wherein a first electric field is created in between the oppositely facing pair of dynodes. A magnetic system is provided for generating a magnetic field.

18 Claims, 5 Drawing Sheets

ION DETECTION SYSTEMS

CROSS-REFERENCE TO RELATED APPLICATIONS

This Application claims priority benefit from U.S. Provisional Application No. 62/854,323, filed May 30, 2019 entitled: "Time of Flight Detector", the disclosure of which is incorporated herein by reference in its entirety.

TECHNICAL FIELD

This disclosure relates generally to ion detection systems, and particularly to ion detection systems comprising electron multiplying assemblies.

BACKGROUND

Time of Flight Mass-Spectroscopy (TOF-MS) comprising TOF detectors are used for charge particle detection, such as ion detection.

There are specific types of fast ion detectors for TOF-MS including Magnetic Time of Flight (MTOF) detectors that comprise a magnetic system which directs a charged particle to a scintillator. There is a need for multiplying the charged particle prior to reaching the scintillator for receiving an augmented output signal.

SUMMARY

According to one embodiment of the present disclosure there is provided an ion detection system, such as in a non-limiting example, an MTOF detector system comprising the magnetic system, provided for directing a charged particle to a scintillator. The magnetic system provides a magnetic field B. A charged particle enters the MTOF detector system and may be converted by a converter to an electron. Prior to reaching the scintillator, the electron enters a secondary electron multiplication assembly configured for multiplying secondary electrons therein. In some embodiments, the secondary electron multiplication assembly comprises at least a pair of oppositely facing dynodes.

A secondary electron emitted by the converter is multiplied upon impingement on the dynode. Accordingly, the ion detection system yields an augmented output signal.

In accordance with an embodiment of the disclosure there is provided an arrangement of the dynodes. In some embodiments of the present disclosure, the dynodes in the secondary electron multiplication assembly are arranged with oppositely facing pairs of dynodes, spaced apart from an adjacent pair of oppositely facing dynodes. A potential difference between opposite dynodes, V1 produces a first electric field (annotated as E1 in FIG. 1), which forms the cross E1×B field with the magnetic field B. The potential difference between the adjacent dynodes, V2, generates a second electric field (annotated as E2 in FIG. 1) which provides the energy needed for secondary emission multiplication.

There is thus provided in accordance with an embodiment of the disclosure an ion detection system comprising an upper plate configured for propagation of ions therethrough, a lower plate comprising a converter configured for converting ions impinging thereon to secondary electrons, a secondary electron multiplication assembly configured for receiving the secondary electrons and comprising at least one or optionally a series of oppositely facing pairs of dynodes, wherein in the optional series of oppositely facing pairs of dynodes, each pair is spaced apart from an adjacent pair, and wherein a first electric field is created in between the oppositely facing pair of dynodes. A magnetic system is provided for generating a magnetic field, wherein the first electric field and the magnetic field are positioned normally to each other and the product of the first electric field and the magnetic field facilitates the secondary electron transfer at least from one of the converter to a pair of dynodes, and a pair of dynodes to an adjacent pair of dynodes, wherein a second electric field is generated at least in between one of the upper plate and a dynode of a dynode pair, and the pair of dynodes to the adjacent pair of dynodes, the second electric field being configured for facilitating the energy needed for secondary electron multiplication, a scintillator configured for receiving the multiplied secondary electrons from the secondary electron multiplication assembly and converting the multiplied secondary electrons impinging thereon to photons, and a light guide for guiding the photons exiting the scintillator to a light sensor, thereby yielding an output signal indicative of the ion.

In some embodiments, the converter is configured for attracting the ion thereto from the upper plate. In some embodiments, the dynode pairs are arranged on the same plane. In some embodiments, the upper plate comprises any one of a window, a grid, a mesh and a slit. In some embodiments, the oppositely facing pairs of dynodes are spaced apart by spacers. In some embodiments, adjacent pairs of oppositely facing pairs of dynodes are arranged to be spaced apart by a predetermined space.

In some embodiments, the lower panel comprises an aperture for allowing the now multiplied secondary electrons to be propelled towards the scintillator. In some embodiments, the ion detection system further comprises an electrical biasing assembly for biasing at least one of the front grid, the converter, one or more dynodes, the scintillator and the light sensor.

In some embodiments, the ion detection system is a magnetic time of flight system (MTOF). In some embodiments, the magnetic system is a preexisting magnetic system of the MTOF detection system and is utilized within the secondary electron multiplication assembly for the secondary electron transfer from the pair of dynodes to the adjacent pair of dynodes.

In some embodiments, a total secondary electron multiplication factor $f_{total}$ of the secondary electron multiplication assembly is determined by $f_{total}=n^f$, wherein n is the number of dynode pairs, and f is the multiplication factor of a single dynode pair. In some embodiments, the electron multiplication factor f is in a range of 2-4 for each single dynode pair.

There is thus provided in accordance with an embodiment of the disclosure a secondary electron multiplication assembly configured for receiving secondary electrons and comprising at least one or optionally a series of oppositely facing pairs of dynodes, wherein in the optional series of oppositely facing pairs of dynodes, each pair is spaced apart from an adjacent pair, and wherein a first electric field is created in between the oppositely facing pair of dynodes, wherein a second electric field is generated in between the pair of dynodes to the adjacent pair of dynodes, the second electric field being configured for facilitating the energy needed for secondary emission multiplication.

In some embodiments, the secondary electron multiplication assembly further comprises a magnetic system for generating a magnetic field, the secondary electron multiplication assembly positioned within the magnetic system, wherein the first electric field and the magnetic field are positioned normally to each other and the product of the first electric field and the magnetic field facilitates the secondary electron transfer from a pair of dynodes to the adjacent pair of dynodes.

In some embodiments, the secondary electron multiplication assembly is positioned within a vacuum chamber.

There is thus provided in accordance with an embodiment of the disclosure, a method for ion detection, comprising directing ions through an upper plate to a lower plate comprising a converter, converting the ions to secondary electrons by impinging on the converter, introducing the secondary electrons into a secondary electron multiplication assembly configured for receiving the secondary electrons and further comprising at least one or optionally a series of oppositely facing pairs of dynodes, wherein in the optional series of oppositely facing pairs of dynodes, each pair is spaced apart from an adjacent pair, creating a first electric field in between the oppositely facing pairs of dynodes, generating a magnetic field, generating a force produced by the first electric field and the magnetic field to facilitate the secondary electron transfer at least from one of the converter to a pair of dynodes, and a pair of dynodes to an adjacent pair of dynodes, generating a second electric field at least in between one of the upper plate and a dynode of a dynode pair, and the pair of dynodes to the adjacent pair of dynodes, the second electric field being configured for facilitating the energy needed for secondary electron multiplication, converting the multiplied secondary electrons from the secondary electron multiplication assembly to photons by a scintillator, and guiding the photons exiting the scintillator to a light sensor, thereby yielding an output signal.

In some embodiments, the magnetic field is generated by a magnetic system. In some embodiments, the magnetic system is a preexisting magnetic system of a MTOF detection system and is utilized within the secondary electron multiplication assembly for the secondary electron transfer from the pair of dynodes to the adjacent pair of dynodes.

DETAILED DESCRIPTION OF EMBODIMENTS

In the following description, various aspects of the present disclosure will be described. For purposes of explanation, specific configurations and details are set forth in order to provide a thorough understanding of the present disclosure. However, it will also be apparent to one skilled in the art that the present disclosure may be practiced without the specific details presented herein. Furthermore, well known features may be omitted or simplified in order not to obscure the present disclosure.

Figure 1:
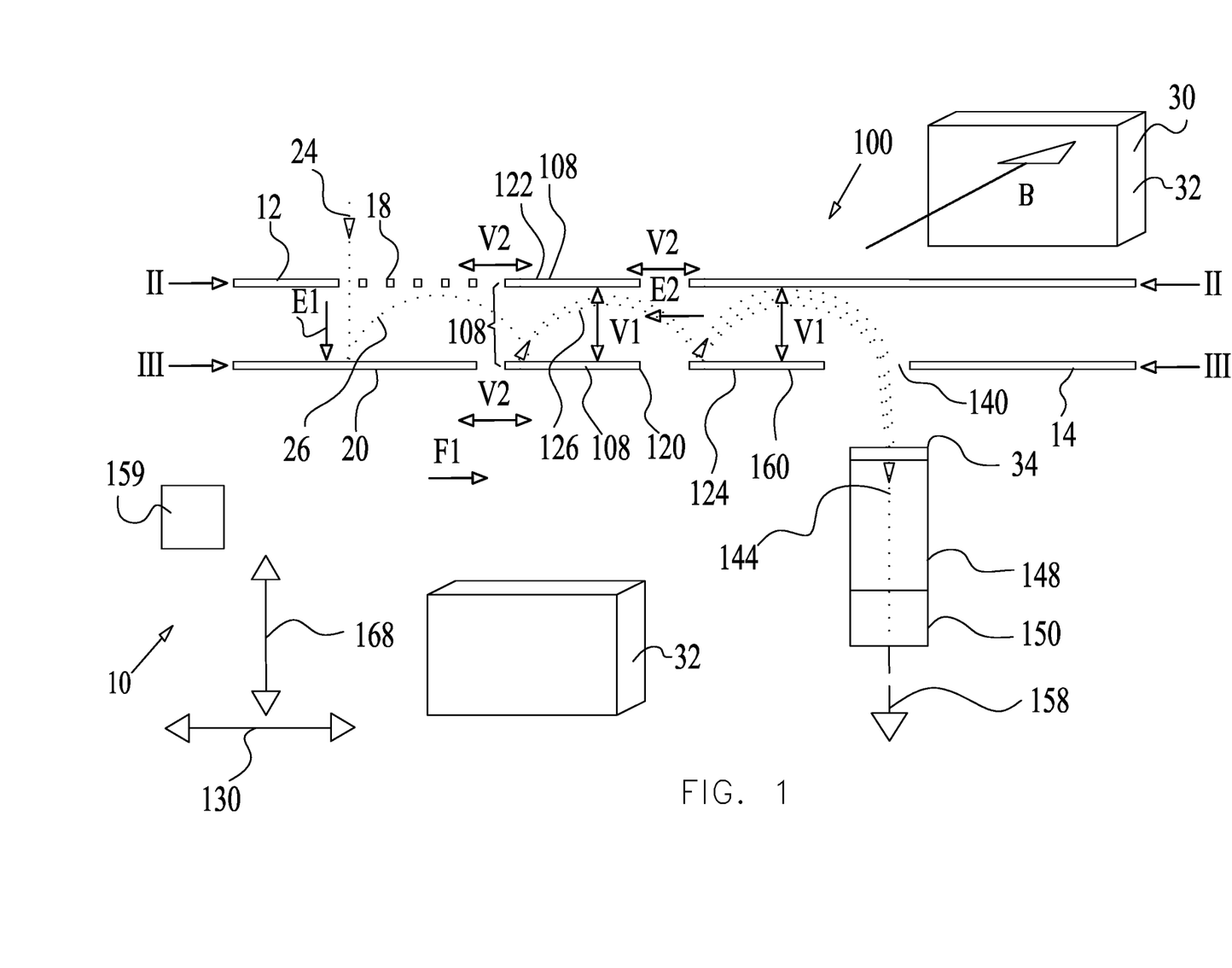
FIG. 1 is a simplified illustration of an ion detection system, constructed and operative according to an embodiment of the present disclosure.
Figure 2:
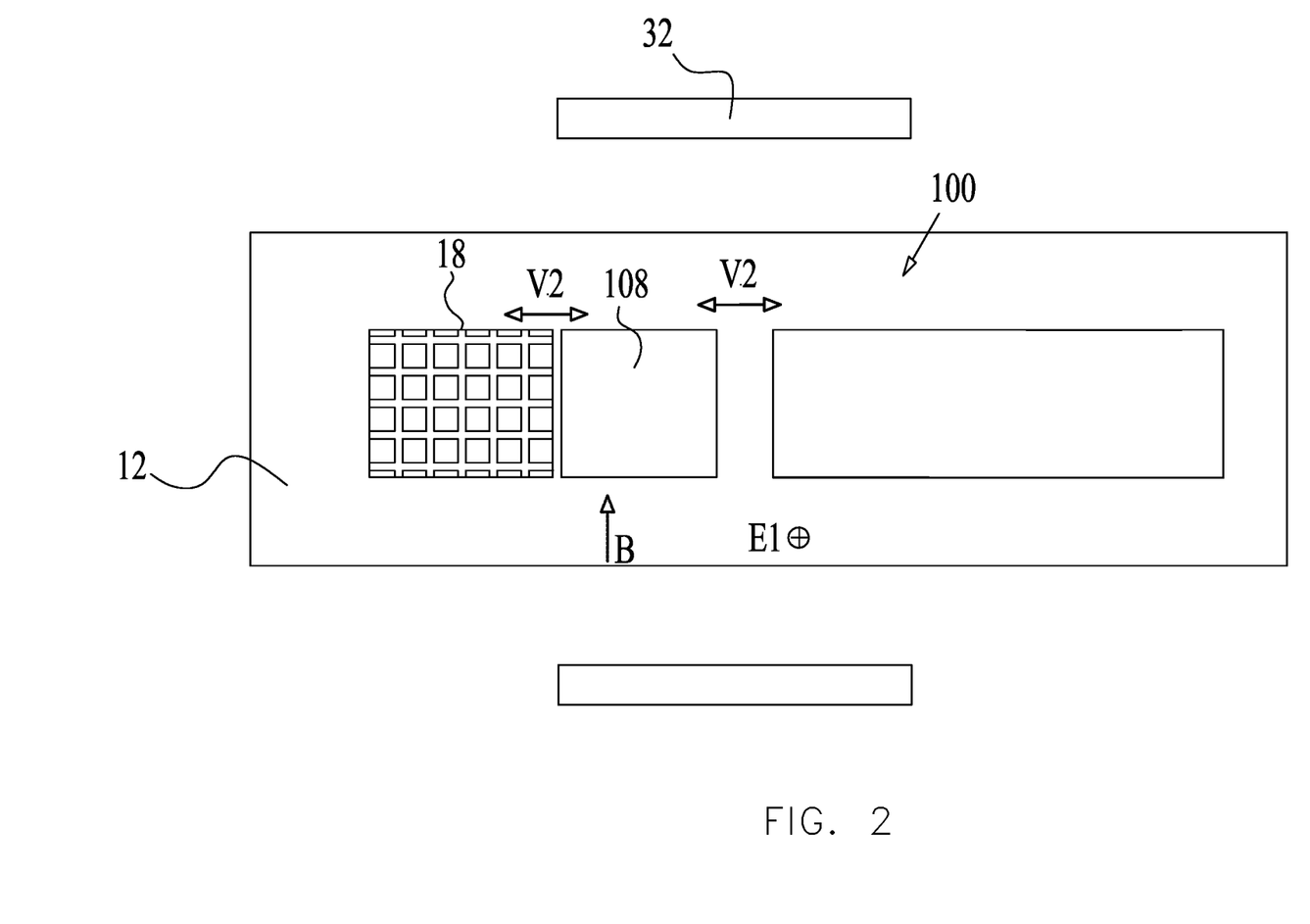
FIG. 2 is a simplified top view illustration of an upper panel of the ion detection system, taken along lines II-II in FIG. 1, constructed and operative according to an embodiment of the present disclosure.
Figure 3:
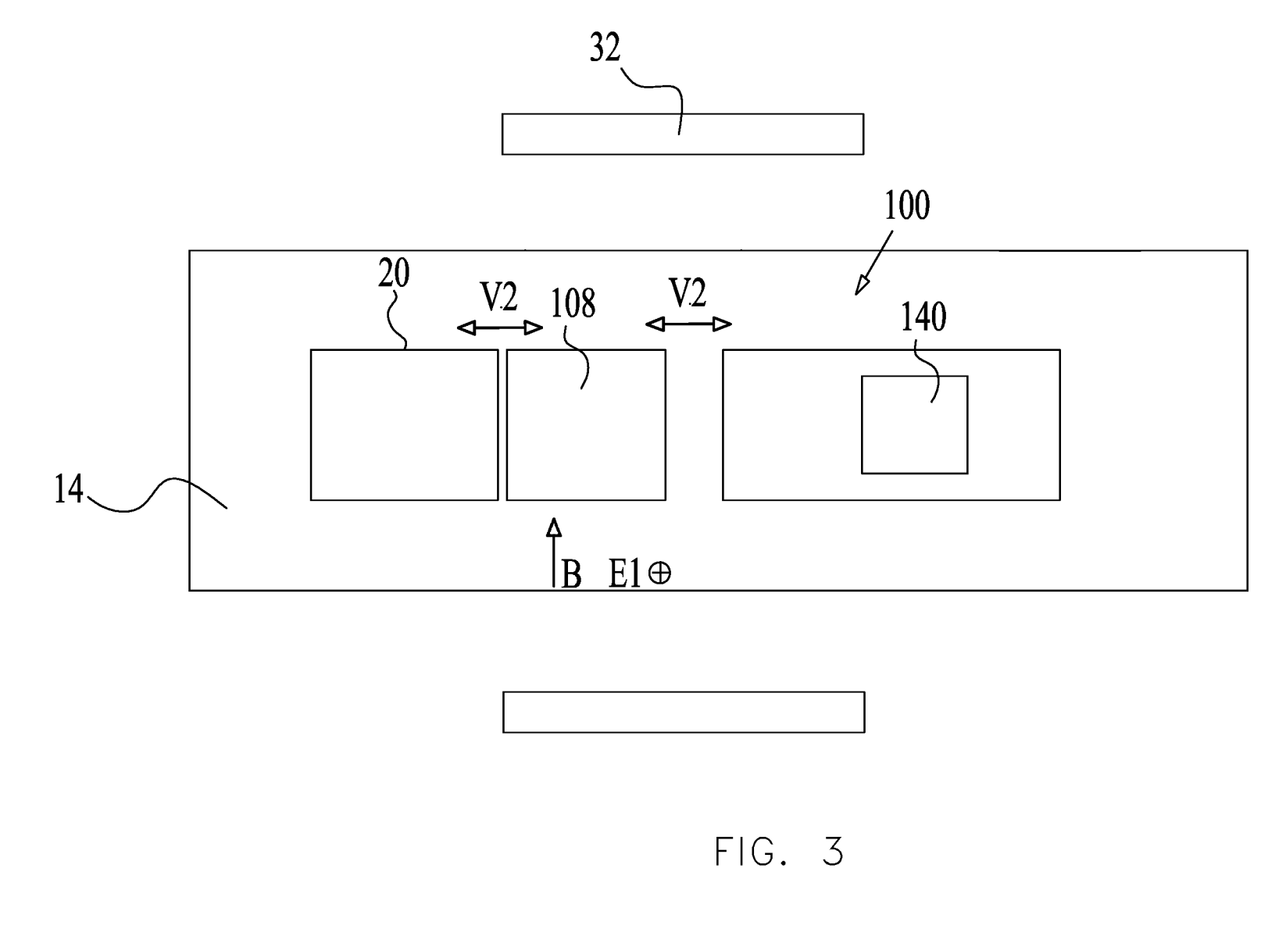
FIG. 3 is a simplified top view illustration of a lower panel of the ion detection system taken along lines III-III in FIG. 1, constructed and operative according to an embodiment of the present disclosure.

As seen in FIGS. 1-3, an ion detection system 10 may comprise an MTOF detector system, which may be for example the MTOF detector described in U.S. Pat. No. 7,180,060, incorporated in its entirety herein or any other suitable ion detection system.

The MTOF detector system may include an upper panel 12 and a lower panel 14. The upper panel 12 may comprise a front plate 18 and the lower panel 14 may comprise a converter, such as a converter plate 20 configured for converting ions 24, (in a non-limiting example positive ions) impinging thereon, to secondary electrons 26. The front plate 18 may comprise a window, grid, mesh, a slit or any other type of aperture of any appropriate size to allow the ion 24 therethrough to be directed to the converter plate 20. The front plate 18 and the converter plate 20 are generally positioned parallel to each other and create the first electric field E1 therebetween.

Figure 5:
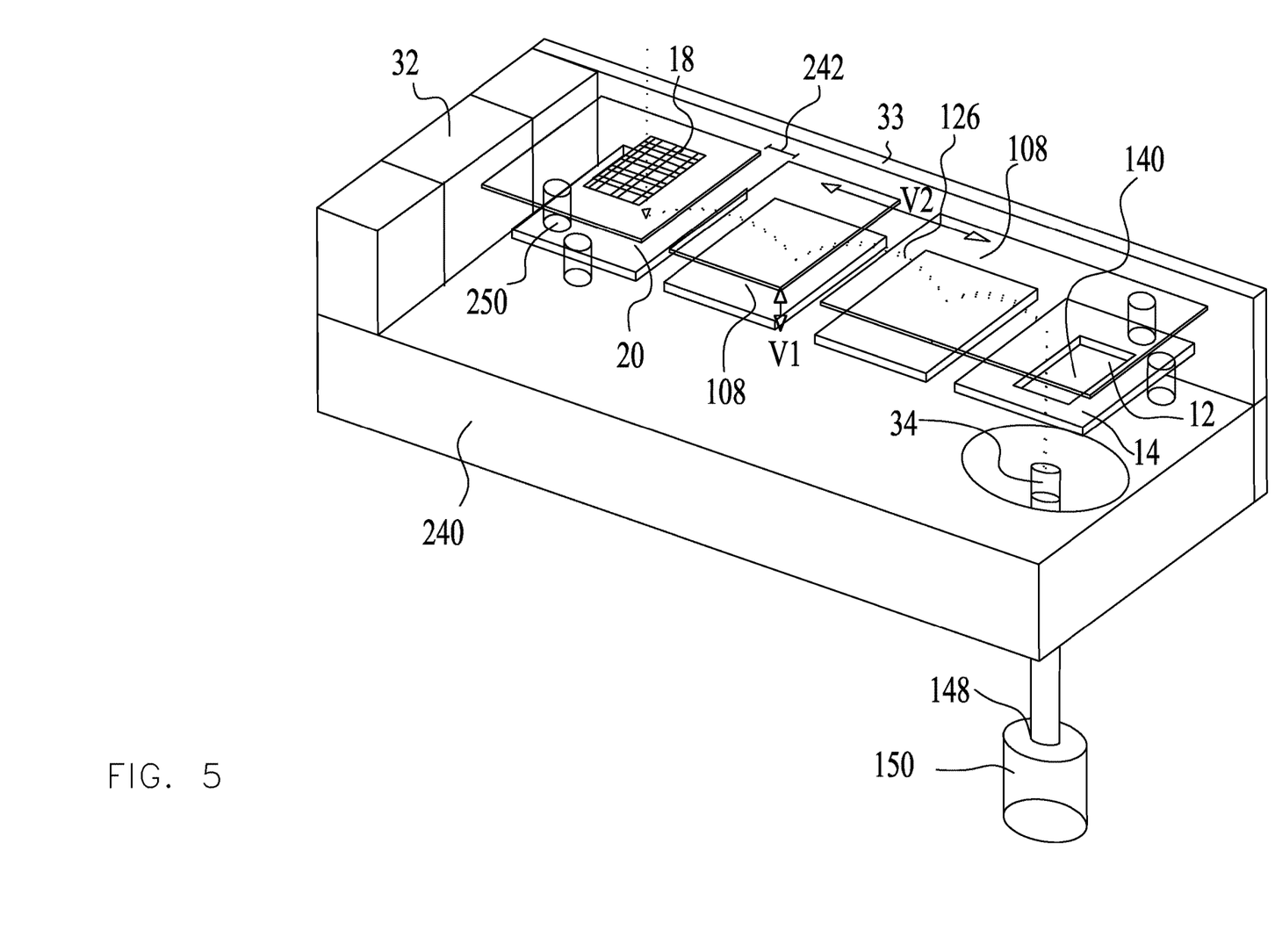
FIG. 5 is a simplified partly assembled illustration of an ion detection system, constructed and operative according to an embodiment of the present disclosure.

A magnetic system 30 comprising a single or plurality of permanent magnets or electromagnets is configured to generate a magnetic field, B, such as a homogeneous or non-homogeneous magnetic field. In some embodiments, as shown in FIGS. 1-3, the magnetic system 30 comprises two oppositely facing permanent magnets, it being appreciated that any suitable means for generating a magnetic field may be provided. In some embodiments, the magnetic system 30 may comprise one or more magnets 32 accompanied by pole pieces 33 configured to generate magnetic field B (FIG. 5).

The magnetic field, B, and the first electric field E1 are positioned normally (namely orthogonally) to each other, thereby creating a crossed E1×B field for propelling the secondary electrons 26 away from the converter 20 towards a scintillator 34.

The orientation of the force produced by the crossed E1×B field depends on the orientation of the electric field E1 and the magnetic field, B. In the example of FIG. 1 the crossed E1×B field produces a generally lateral force F1. The secondary electron 26 is propelled by this lateral force F1 towards the positively biased scintillator 34.

The trajectory of the secondary electron 26 from the converter plate 20 towards the scintillator 34 is subjected to the lateral force F1.

According to some embodiments of the present disclosure there is provided a secondary electron multiplication assembly 100. The secondary electron multiplication assembly 100 comprises a single pair or at least two or a series of dynode pairs 108. The series of dynodes may comprise oppositely facing pairs of dynodes 108, spaced apart from an adjacent pair of oppositely facing dynodes 108. It is noted that a single dynode and a pair of dynodes are denoted by 108.

Substantially, each pair of dynodes 108 is arranged with a potential V1 therebetween. The potential difference V1 generates the first electric field, E1, intermediate the pair of dynodes 108 which comprise a lower voltage biased dynode 120 and a higher voltage biased dynode 122. A potential difference of V2 is set between adjacent pairs of dynodes 108 for generating a second electric field E2. The first electric field E1 may be positioned generally perpendicularly to an axis 130 (FIG. 1) while second electric field E2 generated by V2, may be positioned generally parallel to axis 130. It is noted that the force F1 is generally in the lateral direction though its orientation may be also angular, due to effects of the secondary electrons or other forces.

The force F1 produced by the product of the first crossed E1×B field propels the secondary electron 26 to an adjacent dynode 108. Secondary electron 26 hits the dynode 108 with the energy of V2 and produces multiple secondary electrons 126. The secondary electrons 126 are further propelled by the force F1 to an adjacent dynode of adjacent pairs 108 and hits it with the energy of V2 for further multiplication of the secondary electrons 126.

The dynode series may comprise at least two or many more pairs of dynodes 108, denoted by n. In a non-limiting example, there are 2-8 pairs. In a non-limiting example, there are 1-15 pairs, subranges and values thereof (i.e. n=1-15, subranges and variables thereof). As seen in FIG. 1, the secondary electron trajectory is generally curved intermediate the pairs of adjacent dynodes 108.

In a non-limiting example, V1 has a voltage of about 500V. In a non-limiting example, V1 has a voltage in the range of about 100V-6000V and subranges and values thereof. In a non-limiting example, V2 has a voltage of about 100V. In a non-limiting example, V2 has a voltage in the range of about 20V-800V and subranges and values thereof. In a non-limiting example, the strength of the magnetic field B can be in the range of about 100-500 Gauss, subranges and values thereof.

The force F1 provides a very uniform transit time of the secondary electrons between the adjacent dynodes, thereby minimizing the transit time spread.

The dynodes 108 are electrodes and may be formed of any suitable material, such as stainless steel or aluminum, for example.

By each impingement of the secondary electrons 26 on the dynode 108 the secondary electrons 26 multiply by a factor determined by the material of the dynode 108 and potential difference V2 and possibly other parameters. In a non-limiting example, for a dynode formed of stainless steel the multiplication factor is about 2.5, for a dynode formed of aluminum the multiplication factor is about 4. In a non-limiting example, the multiplication factor may be in a range of about two-four for each multiplication stage and denoted by f. For example, in a system comprising two pairs of dynodes made of aluminum the total multiplication factor is about 16, namely each dynode provides multiplication by 4, thus two pairs of dynodes provide 4×4=16. In a non-limiting example, the multiplication factor may be in a range of about more than one to ten for each multiplication stage (namely for each pair of dynodes 108).

Accordingly, the total secondary electrons multiplication factor $f_{total}$ (i.e. gain) of the electron multiplication assembly 100 is determined by:

$f_{total}=n^f$, namely the number of dynode pairs n in the power of the multiplication factor f of a single dynode pair. It is thus appreciated that the electron multiplication assembly 100 significantly multiplies the secondary electrons 26 and hence significantly augments the output signal 158.

It is noted that the dynodes 108 within the electron multiplication assembly 100 may be formed of the same or different types of materials to control and determine the total secondary electrons multiplication factor $f_{total}$ of the electron multiplication assembly 100.

As described herein, the secondary electrons 26 are directed by the force F1 to impinge upon the dynodes 108 for multiplication thereof while propagating along the longitudinal axis 130 of the ion detection system 10. The lower panel 14 comprises an aperture 140, formed as a window in proximity to a last dynode 124, for allowing the now multiplied secondary electrons 126 to be propelled towards the scintillator 34. The secondary electrons 126 propagate to the scintillator 34 in a trajectory which may be any suitable shape, such as straight or generally curved and with any portion of an arc, such as a turn of 90-300 degrees, subranges and values thereof. In a non-limiting example, the trajectory may define a turn of 180 degrees or 270 degrees.

The scintillator 34 is typically biased with a voltage of about 5-12 kV in a non-limiting example, or any other voltage, relative to dynode 124, for attracting the multiplied secondary electrons 126 thereto. The scintillator 34 is configured for converting the multiplied secondary electrons 126 impinging thereon to photons 144. A light guide 148 guides the photons 144 to a light sensor 150, thereby yielding an output signal 158. The output signal 158 is augmented due to the secondary electron multiplication.

The light sensor 150 may comprise any one of a Photomultiplier Tube (PMT), a Hybrid Photodetector (HPD), a light sensor with a pulse width of less than a few nanoseconds, such as 1-3 nanoseconds, such as in a non-limiting example a sub-nanosecond pulse width or any other suitable light sensor. The components (e.g. the front grid 18, converter 20, one or more dynodes 108, the scintillator 34, the light sensor 150) of the ion detection system 10 may be biased in any suitable manner, such as by an electrical biasing assembly 159. The electrical biasing assembly 159 may comprise any wired and/or wireless means for biasing the components, such as but not limited to voltage dividers, means for power/voltage supplies, etc.

The scintillator 34, light guide 148 and light sensor 150 are shown to be positioned perpendicular to the longitudinal axis 130. In some embodiments, any one of the scintillator 34, light guide or light sensor 150 may be positioned at an angle to the longitudinal axis 130 or parallel thereto.

In some embodiments, the electron multiplication assembly 100 may utilize a preexisting magnet system 30, such that of the MTOF detector system. In some embodiments, a dedicated magnet system may be provided for the electron multiplication assembly 100.

Figure 4:
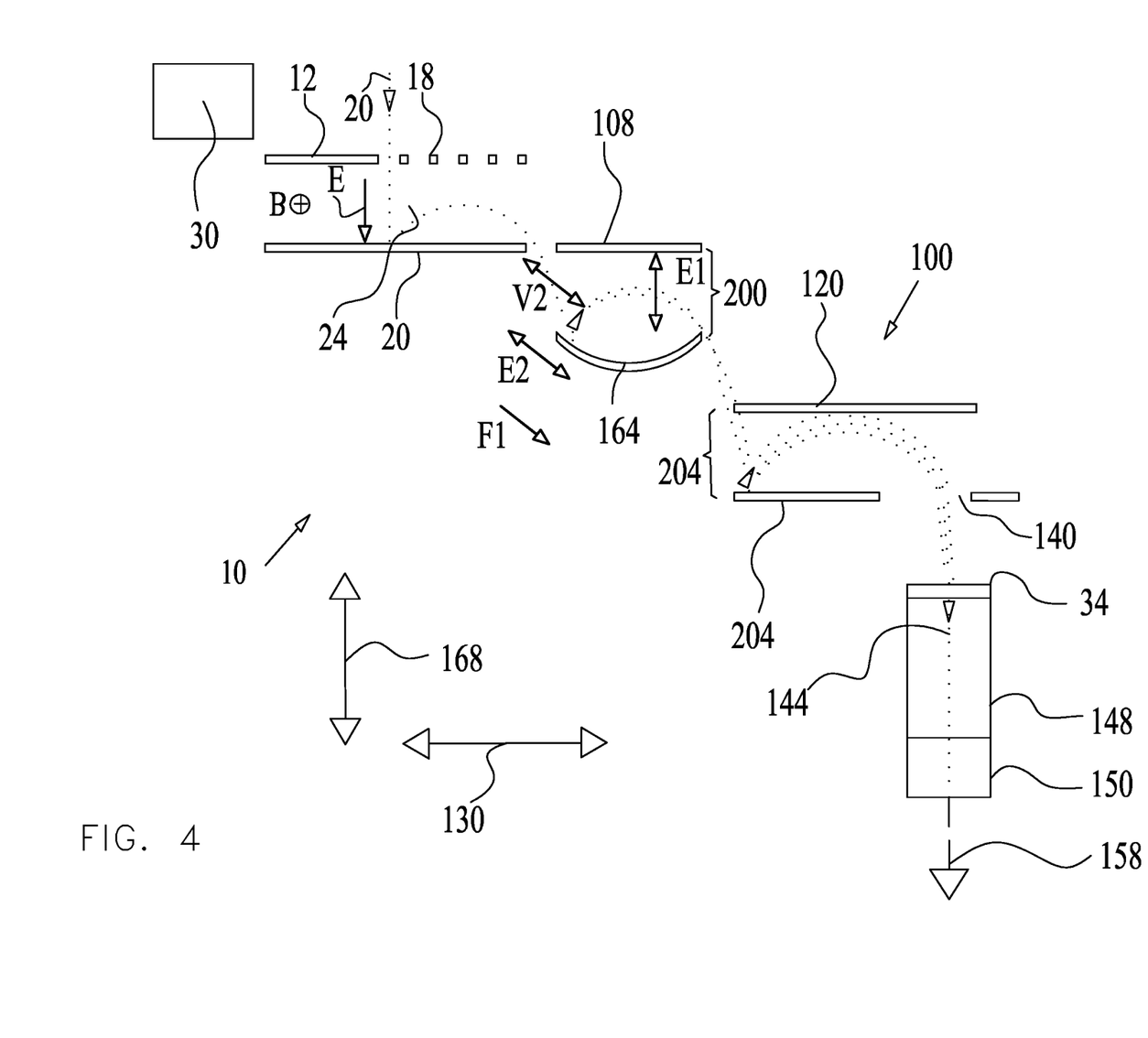
FIG. 4 is a simplified illustration of an ion detection system, constructed and operative according to an embodiment of the present disclosure.

In some embodiments, the dynode pair 108 may comprise a flat surface 160 as seen in FIG. 1. In some embodiments, as seen in FIG. 4 the dynode surface may be formed with a curvature 164.

In FIG. 1 the series of dynode pairs 108 are shown to be arranged at the same plane relative to latitudinal axis 168 (which is perpendicular to longitudinal axis 130). In some embodiments, as seen in FIG. 4, the series of oppositely facing dynodes 108 may be arranged in different planes relative to axis 168, such that the dynode pairs 108 cascade relative to each other. For example, a first dynode pair 200 may be arranged above a second dynode pair 204 relative to axis and partially or fully at an offset relative to axis 130. Accordingly, the second electric field E2 generated between the pairs of dynodes 108 is at an incline, angular to axis 168. The produced force F1 of the E1×B field is at an incline, angular to axis 168, and propels the secondary electrons 126 to propagate from first dynode pair 200 to the second dynode pair 204 and along the electron multiplication assembly 100.

FIG. 5 shows an exemplary MTOF detection system of FIG. 1 in a partially assembled state, where the front pole piece 33 is removed to reveal the components of the MTOF detection system. It is seen that the upper panel 12 and the lower panel 14 are mounted to an insulating base 240 by any suitable means, such as by screws or bolts 250, which may also be used as spacers between the insulating base 240, the upper panel 12 and/or the lower panel 14 along latitudinal axis 168 (FIG. 1). In other words, the oppositely facing pairs of dynodes 108 are spaced apart along the latitudinal axis 168 by any suitable mechanical means such as by spacers 250.

The series of dynodes may comprise oppositely facing pairs of dynodes 108, spaced apart along longitudinal axis 130 by a predetermined gap 242 from an adjacent pair of oppositely facing dynodes 108. The gap 242 is determined such that it is sufficiently small enough to ensure the secondary electrons 126 will be attracted to an adjacent dynode 108, yet sufficiently large enough to prevent inadvertent electrical breakdown occurring between adjacent dynodes 108. In a non-limiting example, the predetermined gap 242 may be in the range of about 0.1-1 millimeters, subranges and variables thereof.

As described in reference to FIGS. 1-4, the secondary electrons 26 are directed by the force F1 to impinge upon the dynodes 108 for multiplication thereof while propagating along the ion detection system 10. The lower panel 14 comprises the aperture 140, formed as a window for allowing the now multiplied secondary electrons 126 to be propelled towards the scintillator 34.

In accordance with an embodiment of the disclosure the ion detection system 10 can be used as a particle detection system for detecting a particle. The particle may comprise any one or more of: an ion, positively or negatively charged, as well as electrons and/or photons. The particle detection system can detect any of the above particles, mutatis mutandis.

In a non-limiting example, the ion detection system 10 may be placed in a vacuum chamber.

In some embodiments, the light sensor 150 may comprise a vacuum-compatible light sensor comprising a housing formed of vacuum-compatible materials and configured for housing a photocathode and a semiconductor diode. The photocathode is configured for converting an impinging photon to a photoelectron, and the semiconductor diode is configured for multiplying the photoelectron impinging thereon. The vacuum-compatible light sensor is configured for being positioned in a vacuum chamber.

While various inventive embodiments have been described and illustrated herein, those of ordinary skill in the art will readily envision a variety of other means, materials, or structure for performing the function, obtaining the results, or one or more of the advantages described herein, and each of such variations or modifications is deemed to be within the scope of the inventive embodiments described herein. More generally, those skilled in the art will readily appreciate that all parameters, dimensions, materials, and configurations described herein are meant to be for example only and that the actual parameters, dimensions, materials, and configurations will depend upon the specific application or applications for which the inventive teachings is/are used. Those skilled in the art will recognize or be able to ascertain using no more than routine experimentation, many equivalents to the specific inventive embodiments described herein. It is, therefore, to be understood that the foregoing embodiments are presented by way of example only and that, within the scope of the appended claims, equivalents thereto, and any claims supported by the present disclosure, inventive embodiments may be practiced otherwise than as specifically described and claimed. Inventive embodiments of the present disclosure are directed to each individual feature, system, article, material, composition, kit, method, and step, described herein. In addition, any combination of two or more such features, systems, articles, materials, compositions, kits, methods, and steps, if such features, systems, articles, materials, compositions, kits, methods, and steps, are not mutually inconsistent, is included within the inventive scope of the present disclosure.

Embodiments disclosed herein may also be combined with one or more features, functionality, or materials, as well as complete systems, devices or methods, to yield yet other embodiments and inventions. Moreover, some embodiments, may be distinguishable from the prior art by specifically lacking one and/or another feature disclosed in the particular prior art reference(s); i.e., claims to some embodiments may be distinguishable from the prior art by including one or more negative limitations.

Also, as noted, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Any and all references to publications or other documents, including but not limited to, patents, patent applications, articles, webpages, books, etc., presented anywhere in the present application, are herein incorporated by reference in their entirety. Moreover, all definitions, as defined and used herein, should be understood to control over dictionary definitions, definitions in documents incorporated by reference, and ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An ion detection system comprising:
   an upper plate configured for propagation of ions therethrough;
   a lower plate comprising a converter configured for converting ions impinging thereon to secondary electrons;
   a secondary electron multiplication assembly configured for receiving the secondary electrons and comprising:
     at least two or optionally a series of oppositely facing pairs of dynodes,
     wherein in the optional series of oppositely facing pairs of dynodes, each pair is spaced apart from an adjacent pair, and
     wherein a first electric field is created in between the oppositely facing pair of dynodes;
   a magnetic system for generating a magnetic field,
   wherein the first electric field and the magnetic field are positioned normally to each other and the product of the first electric field and the magnetic field facilitates the secondary electron transfer at least from one of:
     the converter to a pair of dynodes, and
     a pair of dynodes to an adjacent pair of dynodes;
   wherein a second electric field is generated at least in between one of:
     the upper plate and a dynode of a dynode pair; and
     the pair of dynodes to the adjacent pair of dynodes,
   the second electric field being configured for facilitating the energy needed for secondary electron multiplication;
   a scintillator configured for receiving the multiplied secondary electrons from the secondary electron multiplication assembly and converting the multiplied secondary electrons impinging thereon to photons; and
   a light guide for guiding the photons exiting the scintillator to a light sensor, thereby yielding an output signal indicative of the ion.

2. The ion detection system according to claim 1, wherein the converter is configured for attracting the ion thereto from the upper plate.

3. The ion detection system according to claim 1, wherein the dynode pairs are arranged on the same plane.

4. The ion detection system according to claim 1, wherein the upper plate comprises any one of a window, a grid, a mesh and a slit.

5. The ion detection system according to claim 1, wherein the oppositely facing pairs of dynodes are spaced apart by spacers.

6. The ion detection system according to claim 1, wherein adjacent pairs of oppositely facing pairs of dynodes are arranged to be spaced apart by a predetermined gap.

7. The ion detection system according to claim 1, wherein the lower panel comprises an aperture for allowing the now multiplied secondary electrons to be propelled towards the scintillator.

8. The ion detection system according to claim 1, further comprising an electrical biasing assembly for biasing at least one of the front grid, the converter, one or more dynodes, the scintillator and the light sensor.

9. The ion detection system according to claim 1, wherein the ion detection system is a magnetic time of flight (MTOF) detection system.

10. The ion detection system according to claim 9, wherein the magnetic system is a preexisting magnetic system of the MTOF detection system and is utilized within the secondary electron multiplication assembly for said secondary electron transfer from the pair of dynodes to the adjacent pair of dynodes.

11. The ion detection system according to claim 1, wherein a total secondary electron multiplication factor $f_{total}$ of the secondary electron multiplication assembly is determined by: $f_{total}=n^f$, wherein n is the number of dynode pairs, and f is the multiplication factor of a single dynode pair.

12. The ion detection system according to claim 11, wherein the electron multiplication factor f is in a range of 2-4 for each single dynode pair.

13. A secondary electron multiplication assembly configured for receiving secondary electrons and comprising:
   at least two or optionally a series of oppositely facing pairs of dynodes,
   wherein in the optional series of oppositely facing pairs of dynodes, each pair is spaced apart from an adjacent pair, and
   wherein a first electric field is created in between the oppositely facing pair of dynodes;
   wherein a second electric field is generated in between the pair of dynodes to the adjacent pair of dynodes,
   the second electric field being configured for facilitating the energy needed for secondary emission multiplication;
   wherein the secondary electron multiplication assembly is positioned within a vacuum chamber;
   wherein a total secondary electron multiplication factor $f_{total}$ of the electron multiplication assembly is determined by: $f_{total}=n^f$, wherein n is the number of dynode pairs, and f is the multiplication factor of a single dynode pair.

14. The secondary electron multiplication assembly according to claim 13, further comprising:
   a magnetic system for generating a magnetic field,
   the secondary electron multiplication assembly positioned within the magnetic system,
   wherein the first electric field and the magnetic field are positioned normally to each other and the product of the first electric field and the magnetic field facilitates the secondary electron transfer from a pair of dynodes to the adjacent pair of dynodes.

15. A method for ion detection, comprising:

directing ions through an upper plate to a lower plate comprising a converter;

converting the ions to secondary electrons by impinging on the converter;

introducing the secondary electrons into a secondary electron multiplication assembly configured for receiving the secondary electrons and further comprising at least two or optionally a series of oppositely facing pairs of dynodes, wherein in the optional series of oppositely facing pairs of dynodes, each pair is spaced apart from an adjacent pair;

creating a first electric field in between the oppositely facing pairs of dynodes;

generating a magnetic field;

generating a force produced by the first electric field and the magnetic field to facilitate the secondary electron transfer at least from one of: the converter to a pair of dynodes, and a pair of dynodes to an adjacent pair of dynodes;

generating a second electric field at least in between one of the upper plate and a dynode of a dynode pair; and the pair of dynodes to the adjacent pair of dynodes, the second electric field being configured for facilitating the energy needed for secondary electron multiplication;

converting the multiplied secondary electrons from the secondary electron multiplication assembly to photons by a scintillator; and guiding the photons exiting the scintillator to a light sensor, thereby yielding an output signal.

16. The method according to claim 15, wherein the output signal is augmented by the secondary electron multiplication assembly by a multiplication factor $f_{total}$ determined by: $f_{total} = n^f$, wherein n is the number of dynode pairs, and f is the multiplication factor of a single dynode pair.

17. The method according to claim 15, wherein the magnetic field is generated by a magnetic system.

18. The method according to claim 17, wherein the magnetic system is a preexisting magnetic system of a MTOF detection system and is utilized within the secondary electron multiplication assembly for said secondary electron transfer from the pair of dynodes to the adjacent pair of dynodes.

* * * * *